US011215656B2

United States Patent
Wiedenbauer

(10) Patent No.: US 11,215,656 B2
(45) Date of Patent: Jan. 4, 2022

(54) METHOD AND ASSEMBLY FOR DETECTING PARTIAL DISCHARGES OF AN ELECTRICAL OPERATING DEVICE

(71) Applicant: Siemens Aktiengesellschaft, Munich (DE)

(72) Inventor: Anton Wiedenbauer, Wellheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/648,753

(22) PCT Filed: Sep. 19, 2018

(86) PCT No.: PCT/EP2018/075268
§ 371 (c)(1),
(2) Date: Mar. 19, 2020

(87) PCT Pub. No.: WO2019/063367
PCT Pub. Date: Apr. 4, 2019

(65) Prior Publication Data
US 2020/0271711 A1 Aug. 27, 2020

(30) Foreign Application Priority Data
Sep. 26, 2017 (DE) .................... 10 2017 217 127.8

(51) Int. Cl.
*G01R 31/12* (2020.01)
*G01R 31/327* (2006.01)
(52) U.S. Cl.
CPC ....... *G01R 31/1254* (2013.01); *G01R 31/327* (2013.01)
(58) Field of Classification Search
CPC .......................... G01R 31/1254; G01R 31/327
See application file for complete search history.

(56) References Cited

U.S. PATENT DOCUMENTS

| | | | |
|---|---|---|---|
| 5,396,180 A | 3/1995 | Hampton et al. | |
| 6,300,768 B1 * | 10/2001 | Kato | H02H 1/0015 324/536 |

(Continued)

FOREIGN PATENT DOCUMENTS

| | | |
|---|---|---|
| CN | 1184940 A | 6/1998 |
| CN | 1657963 A | 8/2005 |

(Continued)

OTHER PUBLICATIONS

Translation of CN103078402A (Year: 2021).*

(Continued)

*Primary Examiner* — Huy Q Phan
*Assistant Examiner* — Adam S Clarke
(74) *Attorney, Agent, or Firm* — Wolter Van Dyke Davis, PLLC

(57) ABSTRACT

A method for detecting partial discharges of an electrical operating device, wherein electromagnetic signals are captured at different positions of the operating device in a decentralized manner by a plurality of sensor apparatuses, where a sinusoidal phase progression is centrally determined for a voltage by a voltage-measuring assembly, and at least one phase point characterizing the phase progression is provided, and the electromagnetic signals are each provided with a time stamp, and a partial discharge signal is determined in each of the electromagnetic signals, and the at least one time stamp of the characterizing phase point and the time stamps of the partial discharge signals are taken into consideration by an evaluation assembly in a superposition of the sinusoidal phase progression with the partial discharge signals. An assembly detects partial discharges of an electrical operating device by the method.

13 Claims, 8 Drawing Sheets

(56) References Cited

U.S. PATENT DOCUMENTS

| | | | |
|---|---|---|---|
| 2002/0163344 | A1 | 11/2002 | Rokunohe et al. |
| 2005/0184737 | A1 | 8/2005 | Moriyama et al. |
| 2012/0077444 | A1* | 3/2012 | McMeekin ........ G01R 19/0053 455/67.11 |
| 2012/0209572 | A1 | 4/2012 | Cavallini |
| 2015/0160282 | A1 | 6/2015 | Candela et al. |
| 2015/0355256 | A1 | 12/2015 | Yoshimura et al. |
| 2016/0274176 | A1 | 9/2016 | Di Stefano et al. |

FOREIGN PATENT DOCUMENTS

| | | | |
|---|---|---|---|
| CN | 102597790 | A | 7/2012 |
| CN | 103078402 | A * | 5/2013 |
| CN | 106501690 | A | 3/2017 |
| WO | 9206385 | A1 | 4/1992 |
| WO | 2013185820 | A1 | 12/2013 |

OTHER PUBLICATIONS

"Gasisolierte Schaltanlagen, Baureihe 8DN8 bis 170 kV, 63 kA, 4000 A"; Brochure, Siemens AG; www.siemens.com/energy; 2011; corresponding ENGLISH version attached as "Gas-insulated Switchgear, 8DN8 Series up to 170 kV, 63 kA, 4000 A"; Brochure, Siemens AG; www.siemens.com/energy; 2012.

R. Kurrer, "Teilentladungsmessung im Gigahertz-Frequenzbereich an SF6-isolierten Schaltanlagen"; Berichte aus der Energietechnik, Shaker Verlag, 1997; ENGLISH machine translation of Summary for "Partial discharge measurement in the gigahertz frequency range on SF6-insulated switchgear", Reports from energy technology, Shaker Verlag, 1997, attached.

"Monitoring and diagnostics"; Brochure, Siemens AG; www.siemens.com/em-services; 2015.

Dreher, Andreas, Mohl, Dirk; "Präzise Uhrzeitsynchronisation", Hirschmann, White Paper Rev. 1.2, Der Standard IEEE 1588; corresponding ENGLISH version attached as Dreher, Andreas, Mohl, Dirk; "Precise Clock Synchronization", Hirschmann, White Paper Rev. 12, The IEEE 1588 Standard.

"Assetguard Switchgear Condition Monitoring"; Brochure, Siemens.com, 2012; corresponding ENGLISH version allached as "Assetguard Switchgear Condition Monitoring"; Brochure, Siemens AG, 2015.

PCT International Search Report and Written Opinion of International Searching Authority dated Dec. 19, 2018 corresponding to PCT International Application No. PCT/EP2018/075268 filed Sep. 19, 2018.

* cited by examiner

METHOD AND ASSEMBLY FOR DETECTING PARTIAL DISCHARGES OF AN ELECTRICAL OPERATING DEVICE

CROSS REFERENCE TO RELATED APPLICATIONS

This application is the US National Stage of International Application No. PCT/EP2018/075268 filed 19 Sep. 2018, and claims the benefit thereof. The International Application claims the benefit of German Application No. DE 10 2017 217 127.8 filed 26 Sep. 2017. All of the applications are incorporated by reference herein in their entirety.

FIELD OF INVENTION

The invention relates to a method for detecting partial discharges of an electrical operating device, and to an assembly for detecting partial discharges of an electrical operating device.

BACKGROUND OF INVENTION

Gas-insulated switchgear are known from the product brochure "Gas-insulated Switchgear, 8DN8 series up to 170 kV, 63 kA, 4,000 A" published by Siemens AG, 2011, order n° E50001-G620-A122-V1. In the status monitoring of gas-insulated switchgear (GIS), the key focus is the detection of partial discharges (PDs), as these occur in the majority of fault scenarios. The method of choice is the detection of PDs by the measurement of electromagnetic (EM) waves, which are propagated in the GIS in the event of any PD. These are typically detected in the ultra-high-frequency range (UHF), which ranges from several hundred MHz up to a few GHz in the frequency spectrum.

In the event of a PD, electromagnetic pulses typically occur a number of times per sine wave (of the network voltage, e.g. at 50 Hz). Although these are broadband pulses, the design of GIS is such that they are damped to a greater extent in some frequency ranges than in others. The ideal frequency range for the detection of PDs therefore varies for GIS of different types. A status monitoring method is required to execute the secure detection of PDs, and must therefore be sufficiently sensitive to permit the detection of electromagnetic pulses in the GIS to be monitored. In order to ensure this, upon commissioning, the system is set by means of a "calibrator". The calibrator can deliver an electromagnetic reference pulse, in order to calibrate the method or the corresponding assembly for detecting partial discharges.

A typical set-up of a UHF PD monitoring system is comprised of filter components, a signal amplifier and an analog-digital converter, which can rapidly and accurately generate a 12-bit signal. Moreover, interference signal filtering and cause of failure detection are executed by the "point-on-wave" analysis method. Additionally, a data memory, a display and communication protocols are required. In some cases, the basic hardware and software is employed up to six times per field. This is due to the fact that, e.g. in GIS of a three-phase configuration, a PD measuring device is required up-circuit and down-circuit of a circuit-breaker in each phase respectively. The outcome of the approach applied to date has been complex and expensive systems, which permit the direct analysis of causes of failure and fault severity by technical experts. For example, a digital status monitoring system for GIS, under the trade name "Assetguard PDM", is known from the product brochure "Assetguard Switchgear Condition Monitoring—Integrated Substation Condition Monitoring (ISCM®) for High-voltage Switchgear", Siemens AG 2012, order n°: IC1000-G240-A100-X-4A00. Methods for the evaluation of UHF signals, for the detection of partial discharges in GIS, are also known from the dissertation "Partial discharge measurement in the gigahertz frequency range on SF6-insulated switchgear" by Rolf Kurrer, 1997, Institute of Energy Transmission and High-voltage Engineering of the University of Stuttgart, ISBN 3-8265-2211-7.

In many cases, according to known methods, a "phase-resolved-partial-discharge" diagram (PRPD) is evaluated, as this permits conclusions to be drawn with respect to the cause of a partial discharge. In a PRPD diagram, the partial discharge signal detected is superimposed on a sinusoidal signal for a primary voltage, i.e. the voltage which is present on, and is to be switched by the gas-insulated switchgear. The PD signal detected by the UHF antenna itself permits no conclusion as to the phase of the sine wave on which it has occurred. By means of superimposition in a PRPD diagram, a partial discharge event is assigned to a phase position, in the form of "point-on-wave" (PoW) information. This phase information permits assumptions to be established with respect to the cause of a partial discharge, as partial discharges in GIS are generally initiated at specific times in the phase progression.

A typical set-up of a UHF PD monitoring system incorporates decentralized detection units, in order to restrict cable connection lengths between the antenna and the detection unit (typically shorter than 10 m). Excessive damping of the UHF signals received would otherwise occur. For the execution of a point-on-wave evaluation, a sine wave characteristic on the GIS is generally detected separately for each decentralized detection unit. In the above-mentioned Assetguard system, for example, the sine wave is determined in each case from the voltage supply of the PD monitoring system.

SUMMARY OF INVENTION

Proceeding from the previously known method for detecting partial discharges in an electrical operating device by means of UHF evaluation, the object of the invention is the disclosure of a method which is comparatively simple and cost-effective.

The invention solves this object by a method according to claim 1.

As a voltage measuring assembly, for example, a known phasor measurement unit can be employed. The reference assembly and the time stamp assembly, for example, can be constituted in each case by a digital signal processor and corresponding software. The evaluation assembly can also be constituted by conventional computing means such as, for example, a digital signal processor or a computer.

A core aspect of the method according to the invention is that the voltage present on the operating device is detected only once, in a centralized manner, rather than n-times in a decentralized manner. To this end, the central components—in the same way as the decentralized components—are provided with an internal time reference, which is synchronized with an external time server.

This provides the option for the application of time stamps to the measured reference voltage and the decentrally detected pulses, for the purpose of subsequent evaluation. On the basis of the internal time reference, by means of appropriate metrological means, characteristic points in the sine wave are determined, e.g. the time points of zero-crossings on the rising edge (t0, t1 . . . tn). In consideration of any dead times or delays in the detection of an electromagnetic pulse or a partial discharge, the resulting PD measuring result can be superimposed with the centrally measured sine wave.

Consequently, conversely to previous methods for detecting partial discharges, a centralized measurement of the reference voltage(s), and a decentralized superimposition of the PD measurement(s) with the reference voltage are executed, wherein each element of information is exchanged in a digital and packet-oriented manner. The system components are mutually, but also, in principle, externally temporally synchronized.

This provides a series of advantages. A sufficient number of voltage converters are not always available to supply all the decentralized components with sine information from the voltage converters. Known alternatives to measurement on a voltage converter such as, for example, measurement on the voltage supply or measurement of a flicker frequency of fluorescent tubes are inaccurate with respect to the actual sinusoidal signal, and with respect to mutual synchronization.

According to the invention, an existing communication channel can be employed, thereby omitting any additional wiring and saving costs.

In a form of embodiment of the method according to the invention, by reference to the time stamp of the partial discharge signals, a connection to events occurring on the operating device is established. Correspondingly, said events must also be provided with time stamps, which permit temporal synchronization.

In a further development of this form of embodiment, said events comprise at least one of the following events: protection events, voltage overshoots and switching events. The constitution of an arc—and the duration thereof—further to a switching event is frequently described as the "arcing time". This is the time to the quenching of an arc within a GIS. An arc of this type occurs during switching processes, wherein the duration of the arc provides an indication of a fault in the GIS. Protection events can be detected, for example, by the superimposition of "COMTRADE files" on the partial discharge.

In a form of embodiment of the method according to the invention, internal and/or external antennae are employed as sensor devices for the reception of electromagnetic signals. In each case, internally and externally received UHF signals are evaluated in the same manner according to the invention. If a PD signal which is detected by means of an internal antenna is also present in the UHF signals received by an associated external antenna, this represents an external source of interference, rather than a PD occurring in the GIS. Consequently, a signal thus identified as external interference is not processed as a partial discharge, and is not considered in any further evaluation.

In a further form of embodiment of the method according to the invention, a gas-insulated electrical switchgear is employed as an operating device. This is an advantage, as partial discharges can frequently occur in GIS, and are indicative of faults in the device. In normal operation, the latest GIS should not produce any partial discharges.

In a further form of embodiment of the method according to the invention, the electric voltage is centrally measured on a voltage converter for the operating device. This is advantageous, in that the voltage characteristic of the connected operating device can be measured on the voltage converter in a particularly simple manner.

In a further form of embodiment of the method according to the invention, the superimposition is evaluated in each case, in order to detect a cause of the respective partial discharge. This provides an advantage, in that the superimposition of the sinusoidal voltage characteristic with the detected partial discharge permits a conclusion to be drawn with respect to the causes of said partial discharge. The evaluation or interpretation of superimposition can be executed mechanically or by an engineer.

In a further form of embodiment of the method according to the invention, the superimposition is executed by a point-on-wave method in each case. This is an advantage, as the "point-on-wave" method is time-tested.

In a further form of embodiment of the method according to the invention, the precise time protocol is employed for the time stamps. This is advantageous, in that the "precise time protocol" (PTP) provides a particularly accurate and cost-effective option for the application of time stamping. This can be implemented by means of software only, such that costs for additional hardware are eliminated. By means of software implementation, a synchronization of accuracy to within a few µs is achieved, wherein absolute accuracy is dependent upon the type of PTP implementation. From the publication "White Paper on Precision Clock Synchronization—IEEE Standard 1588 Rev. 1.2", published by the University of Reutlingen, a PTP implementation is known, by means of which an accuracy of 50 µs can be achieved. Resolution of electromagnetic pulses or partial discharges is generally executed at a scanning frequency of 5 kHz. This gives a time interval of 200 µs between two measured values. For a deviation of up to 100 µs between centralized and decentralized components, it should therefore be possible for each individual PD measurement to be correctly assigned. The absolute accuracy of internal clocks is thus of secondary importance only—the relative accuracy of time stamps in relation to each other, associated with the success of the method according to the invention, is a more critical factor.

In order to minimize the complexity of wiring, the TCP/IP protocol can be employed for the execution of time synchronization and for the transmission of the sine characteristic, as other measured values of a GIS are typically transmitted via this interface in any event.

In a further form of embodiment of the method according to the invention, the time stamps are defined to a margin of accuracy of less than 100 µs. This is advantageous, in that a high degree of accuracy of this type permits a sufficiently accurate superimposition of the sinusoidal phase progression with the partial discharge signals.

In a further form of embodiment of the method according to the invention, the sinusoidal phase progression is defined for a plurality of phases, and the partial discharge signals are assigned to one of the plurality of phases in each case. This is advantageous in that, e.g. in a GIS for the switching of a three-phase high voltage, by means of a distinction between the phases, phase-specific detection of partial discharges is permitted.

In a further form of embodiment of the method according to the invention, the time points of zero-crossings on a positive voltage rise are employed as characteristic phase points. This is advantageous in that e.g., as a result, two characteristic phase points are generated per 360° phase progression, which is both simple and appropriate for the determination of the time stamp.

Proceeding from previously known assemblies for the detection of partial discharges in an electrical operating device by means of UHF evaluation, a further object of the invention is the disclosure of an assembly which can be employed for monitoring a GIS in a comparatively simple and cost-effective manner.

The invention solves this object by an assembly according to claim 11. Preferred forms of embodiment proceed from the dependent claims 12 to 15. Correspondingly, the same advantages proceed from the assembly according to the invention, and its forms of embodiment, as those described above with reference to the method according to the invention.

BRIEF DESCRIPTION OF THE DRAWINGS

In the interests of the clarification of the invention, in schematic representations.

DETAILED DESCRIPTION OF INVENTION

Figure 1:
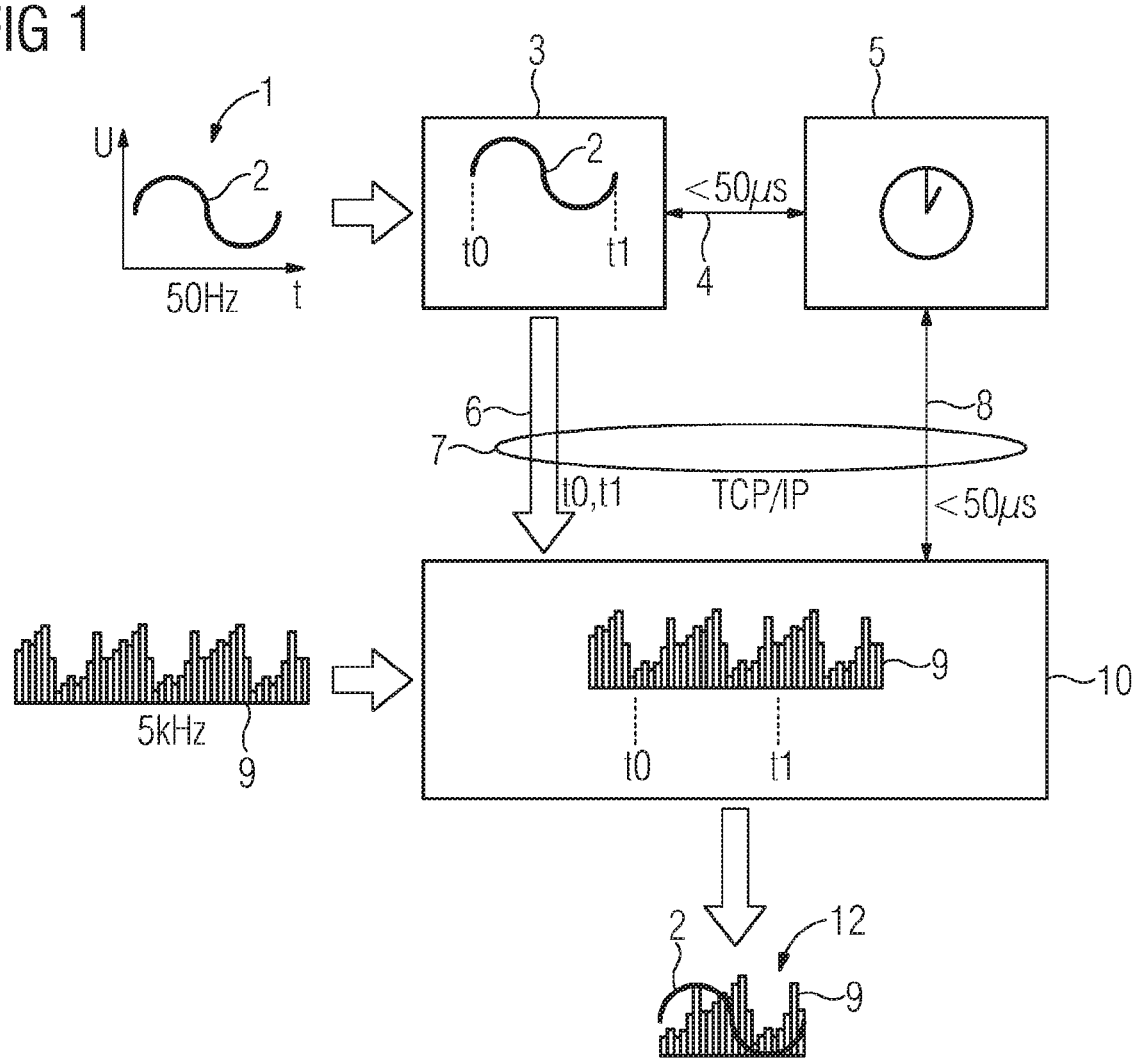
FIG. 1 shows a first exemplary embodiment of the invention.

FIG. 1 shows a schematic representation of a first exemplary embodiment of the method according to the invention. By means of a voltage measuring assembly 3, a sinusoidal phase progression or voltage progression 2 is centrally measured for a voltage at 50 Hz. U represents the voltage amplitude. By means of an unrepresented reference assembly, at least one characteristic phase point is determined in the phase progression 2. In this example, the phase points T0 and T1 are determined such that said phase points are set at a zero-crossing on a positive voltage rise. In the example represented, the phase points T0 and T1 are located respectively at 0° and 360° of the voltage progression. The voltage measuring assembly 3 is connected to a reference assembly 5 via a data communication link 4. This is a time server, which employs the precise time protocol. The reference assembly 5, with a time error of less than 50 µs in relation to the reference time, delivers time stamps for the two characteristic phase points T0 and T1 via the communication link 4. The phase points T0 and T1 thus time-stamped are transmitted via a data message 6, which is delivered via a communication network 7, e.g. using the TCP/IP protocol, to an evaluation assembly 10. For example, in the left-hand part of the illustration, an electromagnetic signal 9 at a predefined position of the operating device is detected, in a decentralized manner, by means of an (unrepresented) sensor device, with a resolution of 5 kHz. The electromagnetic signal 9 is transmitted to the evaluation assembly 10. By means of a time stamp assembly which, in this example, is combined with the reference assembly 5, a time stamp is also provided for the electromagnetic signal 9 via a data communication link 8, with a time error of less than 50 µs in relation to the reference time. Thus, firstly, the characteristic phase points T0 and T1 with their corresponding time stamps, and secondly the measured electromagnetic signal 9, which has also been marked with a time stamp, are present in the evaluation assembly 10. As a result, time stamps for the phase points T0, T1 and the electromagnetic signal can be considered, and superimposed in a further step. The result is a superimposition 12 of the sinusoidal phase progression 2 of the previously measured input voltage of the operating device with the electromagnetic signal 9 which has been measured by means of the sensor device. By reference to this superimposed diagram 12, commonly described as the "point-on-wave" method, partial discharges can be detected, and causes of failure identified by the relationship thereof with the voltage progression.

Figure 2:
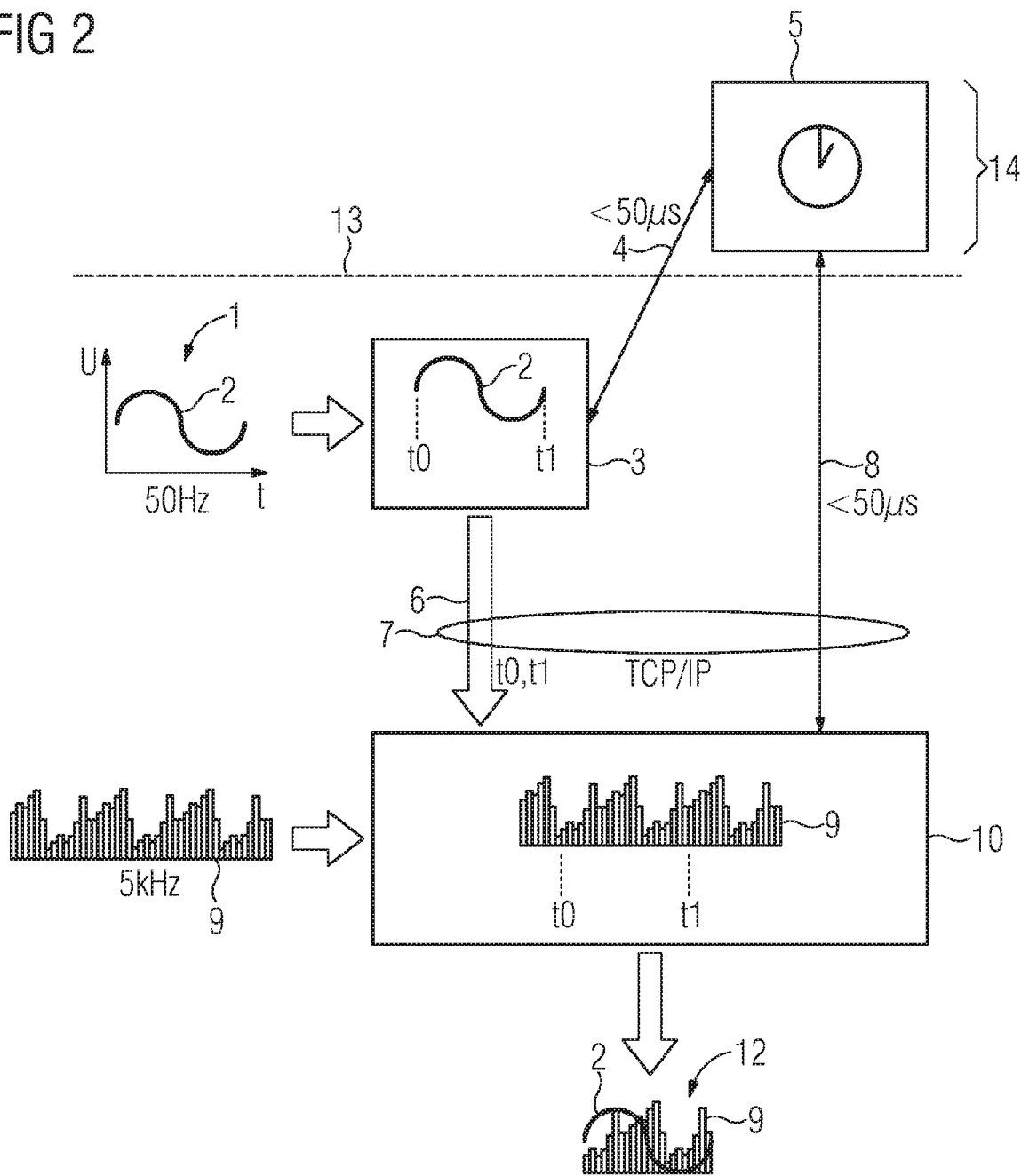
FIG. 2 shows a second exemplary embodiment of the invention.

In the second exemplary embodiment according to FIG. 2, by way of distinction from the method according to FIG. 1, the reference assembly 3 or the time stamp assembly are no longer provided in direct spatial proximity to the voltage measuring assembly 3 and the evaluation assembly 10. Instead, the external time server 5 is provided in a region 14, the spatial separation of which is indicated by a broken line 13. The region 14 can be, for example, an external data center or a website which, via data communication links 4, 8, communicates with the further components, namely, the voltage measuring assembly 3 and the evaluation assembly 10, using a conventional Internet protocol. This exemplary embodiment provides an advantage in that, for a plurality of locally executed measuring methods or assemblies, a single time server in a central position can be provided. This saves costs, and moreover permits the trouble-free maintenance and updating of the reference assembly or time stamp assembly 5.

Secondly, it must be ensured that the data communication links 4, 8 can compare the internal clock times or the corresponding time stamps with sufficient accuracy. In general, it is necessary to maintain a time error of less than 50 µs, such that the internal clock times of the assemblies 3, 10 show a maximum time error of 100 µs.

Figure 3:
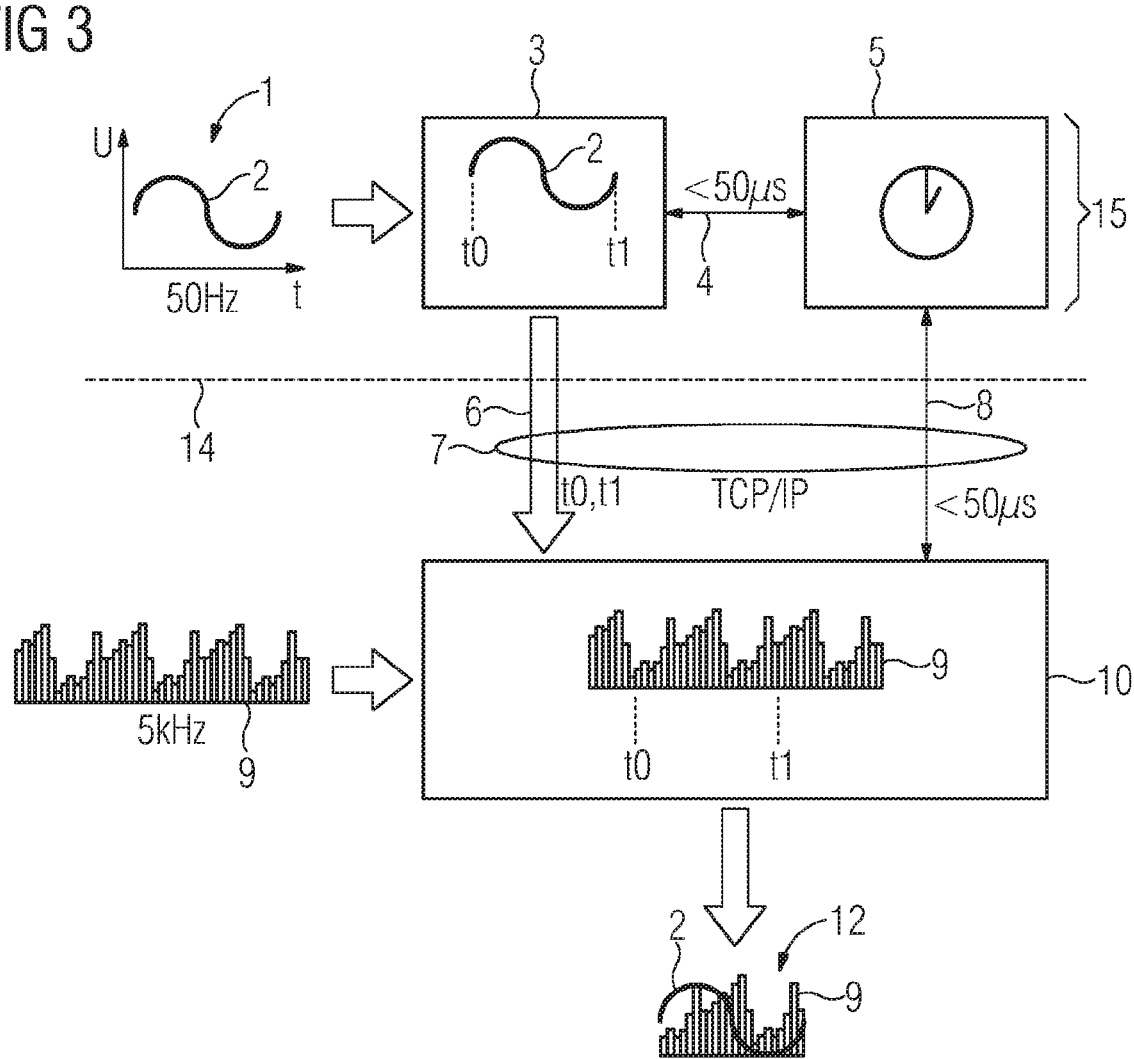
FIG. 3 shows a third exemplary embodiment of the invention.

FIG. 3 shows a third exemplary embodiment of the invention. The time server 5, together with the reference assembly and the time stamp assembly, and the voltage measuring assembly, are provided in a region 15 which is indicated by the broken line 14. In this exemplary embodiment, only the evaluation assembly 10 and the unrepresented sensor devices are arranged directly on the operating device which is to be monitored. The voltage measurement and the time stamp are generated in a location which is not arranged in the immediate vicinity.

Figure 4:
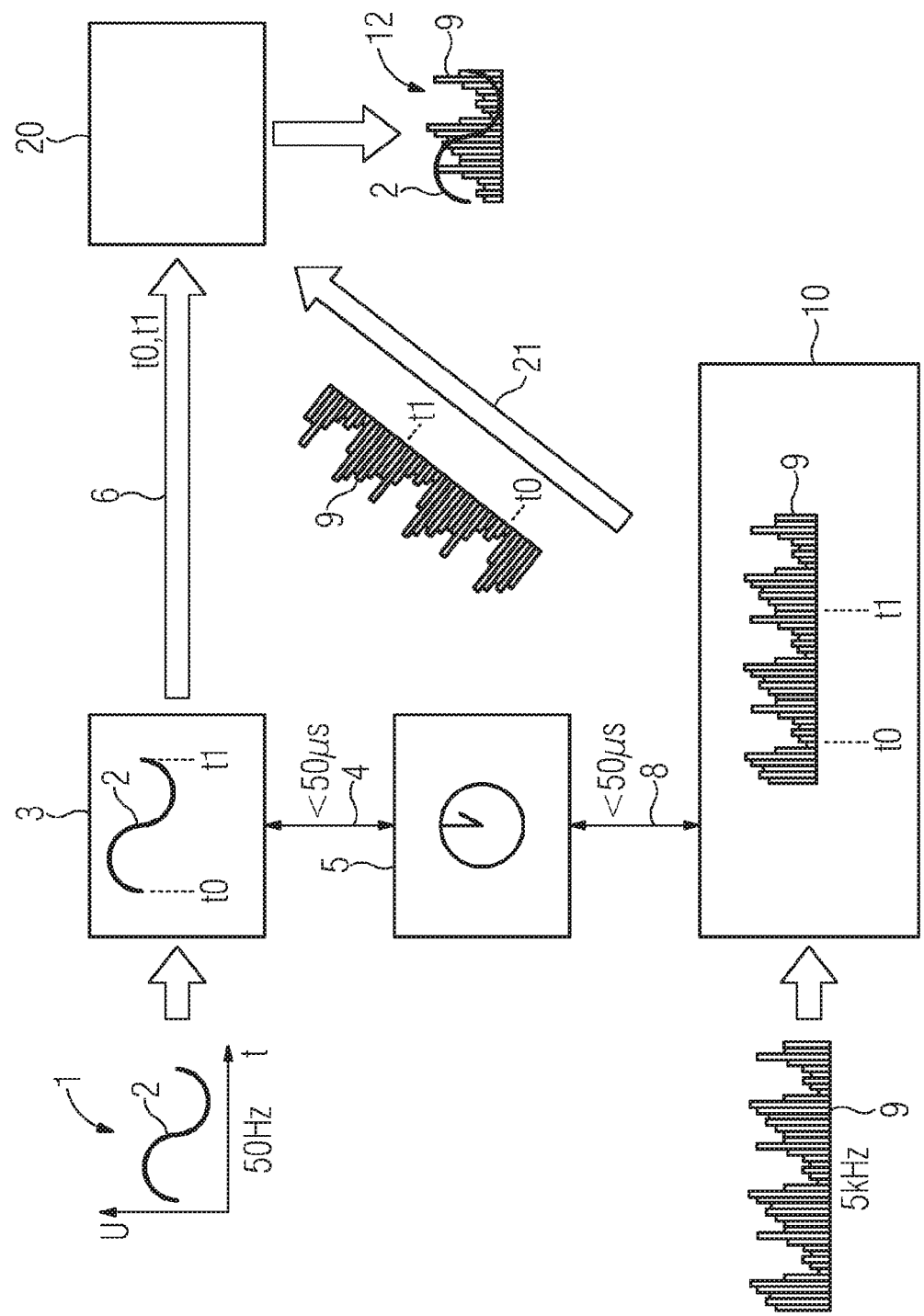
FIG. 4 shows a fourth exemplary embodiment of the invention.

In the exemplary embodiment according to FIG. 4, the superimposition 12 is not executed by means of the evaluation assembly 10 but, instead, the evaluation assembly 10 delivers the electromagnetic signals 9 with marked characteristic phase points T0, T1 to a superimposition device 20. This superimposition device 20 generates the superimposition 12.

Figure 5:
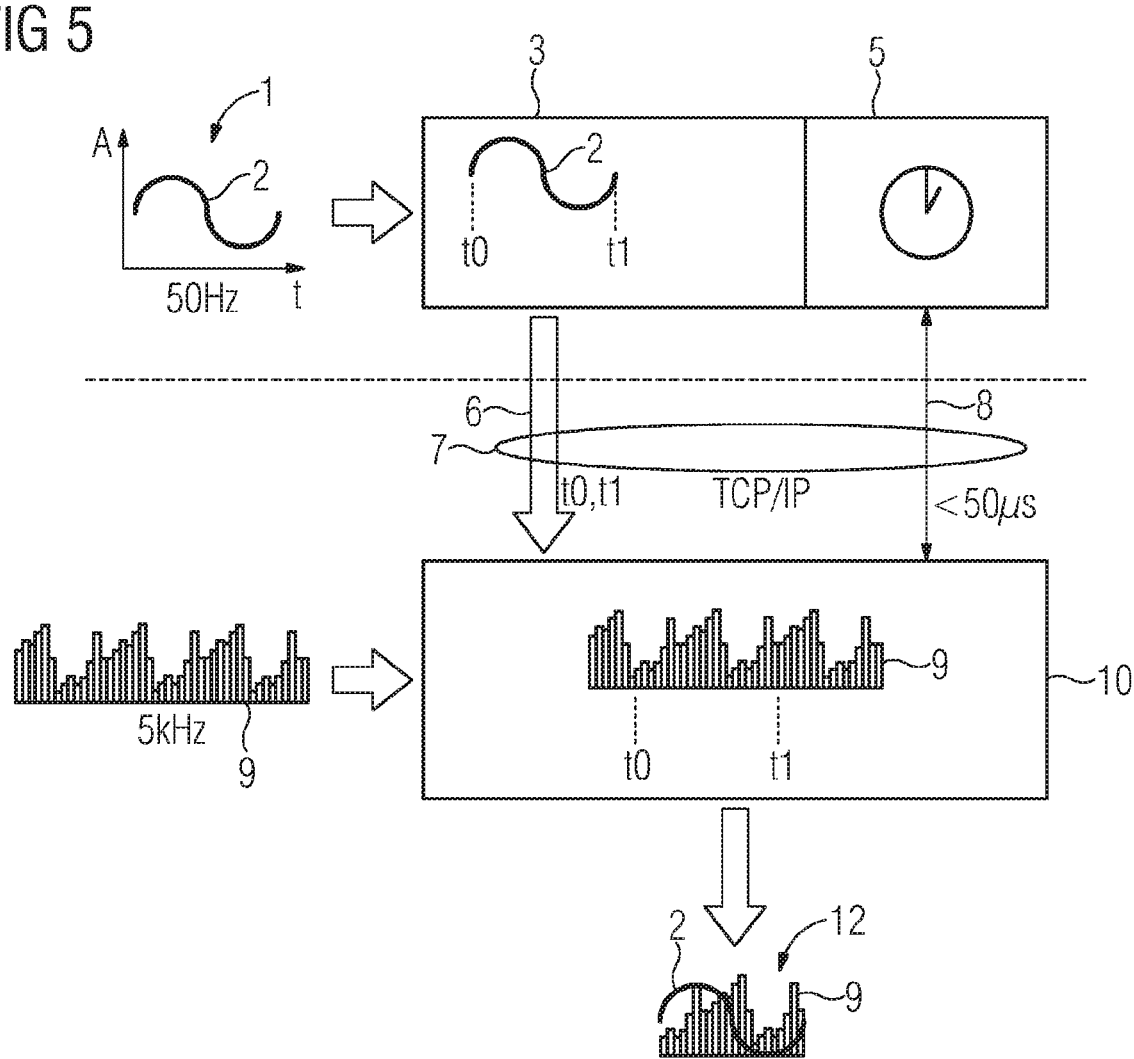
FIG. 5 shows a fifth exemplary embodiment of the invention.

In the exemplary embodiment according to FIG. 5, the reference assembly 5 or the time stamp assembly is directly connected to the voltage measuring assembly 3. The communication link 4 can thus be omitted, thereby improving the accuracy of evaluation by this method, on the grounds of an even greater reduction in time errors. The time error of the voltage measuring assembly 3 and the evaluation assembly 10 is only dependent upon the communication link 8. Given an otherwise equal synchronicity of 50 µs, the accuracy of evaluation by the method can thus be increased. Conversely, in the event of constant accuracy according to the method, the time error of the components 5 and 10 can be reduced to 100 µs.

Figure 6:
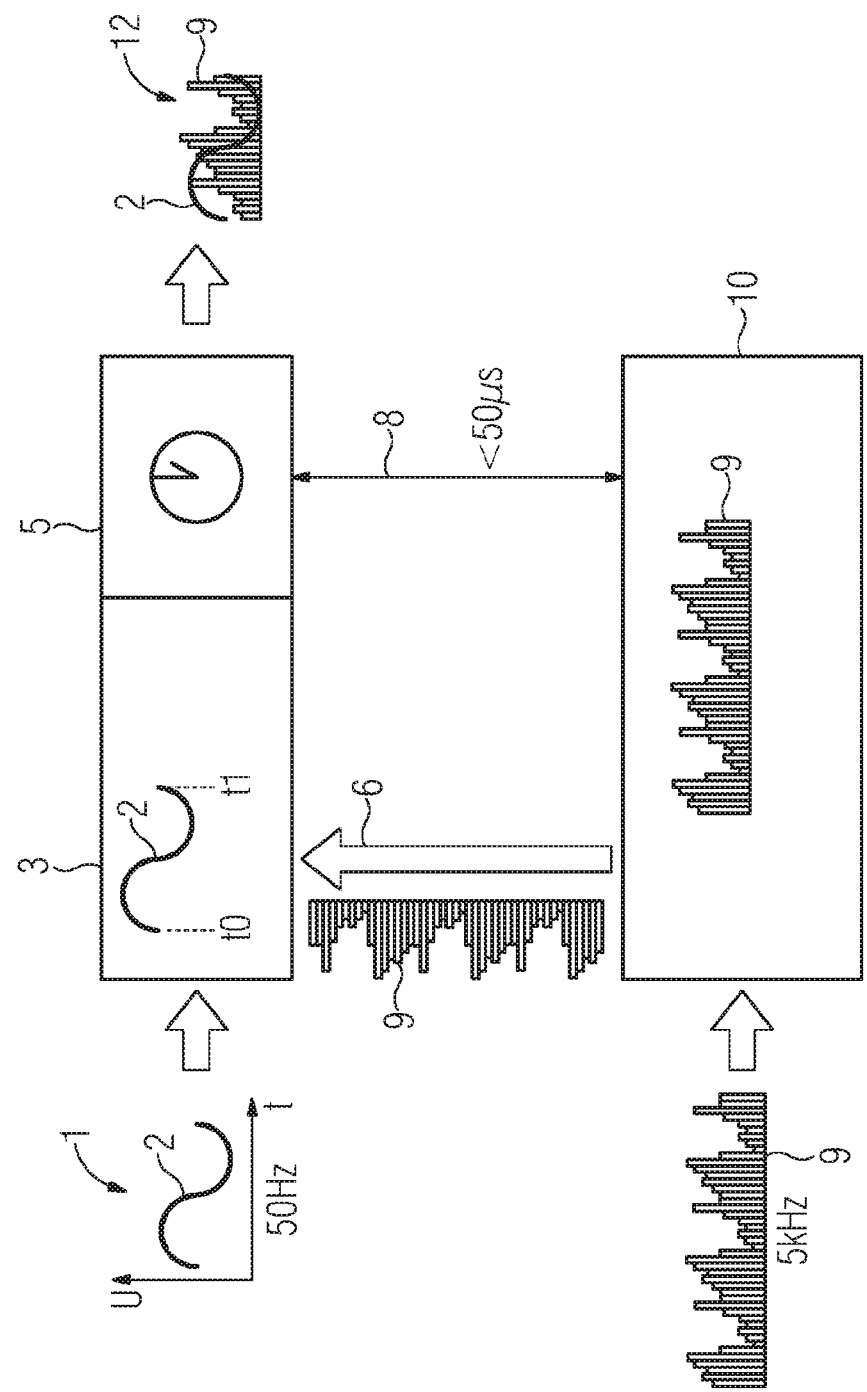
FIG. 6 shows a sixth exemplary embodiment of the invention.

In the exemplary embodiment according to FIG. 6, a combined assembly is employed, in which the voltage measuring assembly 3 is combined together with the reference assembly 5 or the time stamp assembly. The assembly is moreover configured to also generate the superimposition 12. To this end, the assembly receives the electromagnetic signal 9, which carries a time stamp, from the evaluation assembly 10. This set-up provides an advantage, in that it is only necessary for the sensor devices to be provided in the actual locality whereas, for the entire facility or electrical installation, an assembly can deliver the evaluation in a centralized manner.

Figure 7:
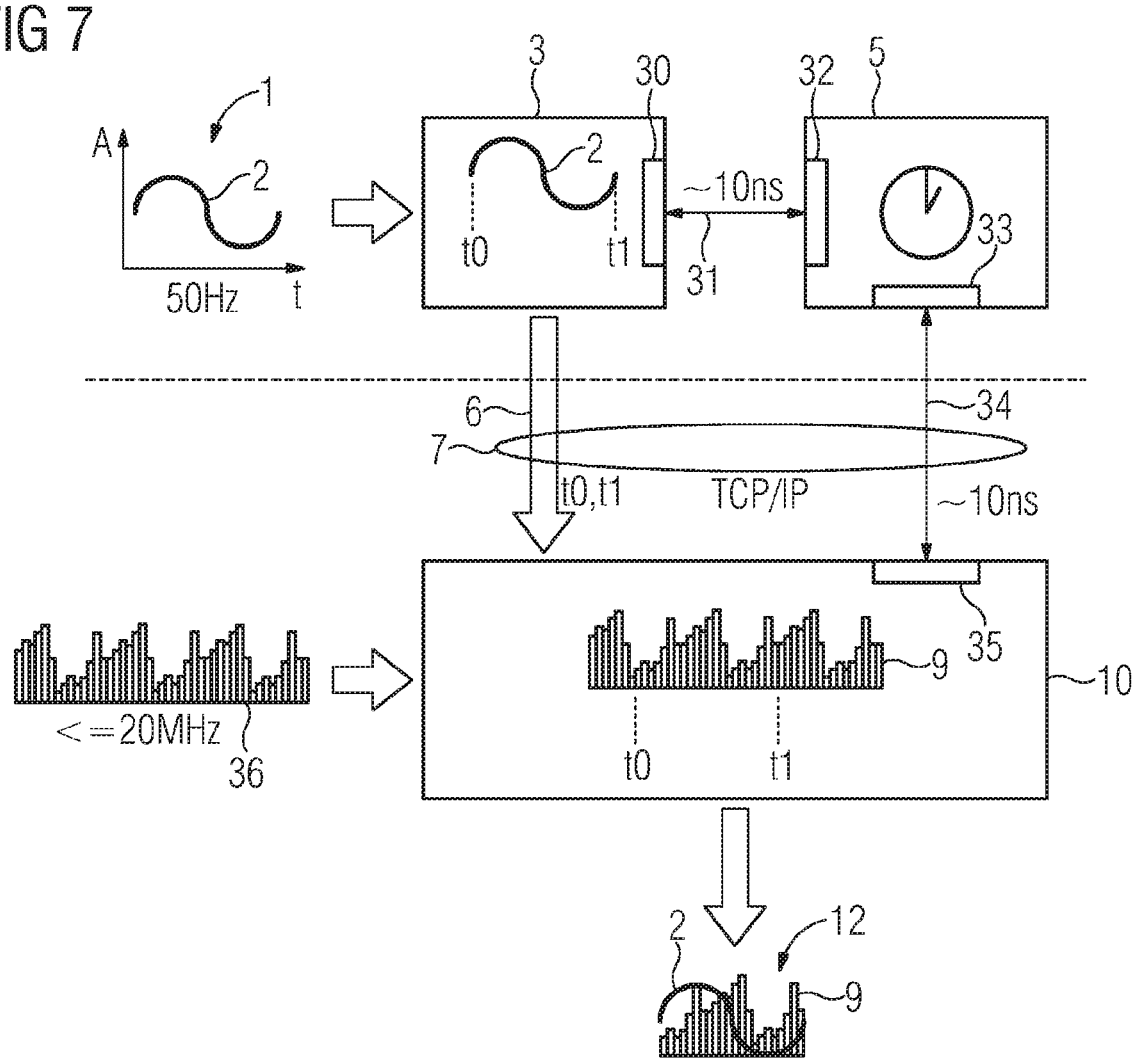
FIG. 7 shows a seventh exemplary embodiment of the invention.

In the exemplary embodiment according to FIG. 7, in order to increase the accuracy of the synchronization or of the time stamps, hardware-based solutions are employed. A circuit which is configured for time synchronization by means of PTP is thus responsible for the synchronization of signals in the nanosecond range. As a result, even higher scanning frequencies can be successfully synchronized, thus further increasing the accuracy of the superimposition 12. In order to achieve this, in a similar procedure to that represented in FIG. 1, a hardware-based component 30, 32, 33, 35 is respectively provided on the voltage measuring assembly 3, the reference assembly 5 and the evaluation assembly 10.

Figure 8:
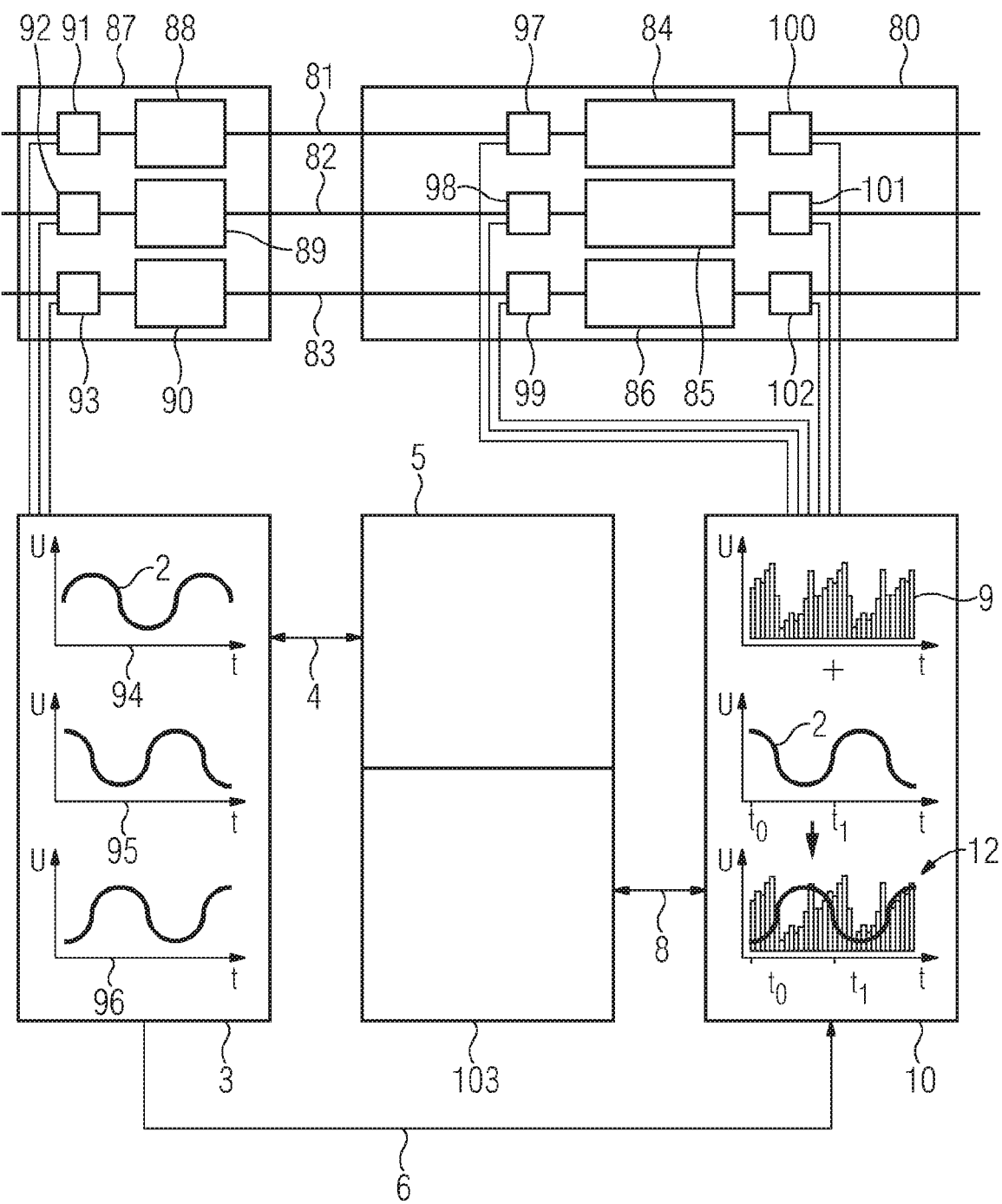
FIG. 8 shows an eighth exemplary embodiment of an assembly according to the invention.

In the exemplary embodiment according to FIG. 8, a gas-insulated switchgear 80 is represented. For each of the three phases 81, 82, 83, this comprises a dedicated circuit-breaker 84, 85, 86. Up-circuit and down-circuit of the respective circuit-breaker 84, 85, 86, sensor devices 97-102 or internal antennae are provided in each case, which are configured for the decentralized detection of electromagnetic signals. A voltage converter 87, having a conversion device 88, 89, 90 for each phase 81, 82, 83, is further provided. In the voltage converter 89, a voltage sensor 91, 92, 93 is provided for each phase 81, 82, 83, which is provided with a voltage measuring assembly 3 for the central determination of a sinusoidal phase progression 2 of an electric voltage. A voltage progression is thus measured for each phase 81, 82, 83.

In the voltage measuring assembly 3, a phase progression 2 of the voltage is determined for each of the phases, which is represented schematically here by the diagrams 94, 95, 96. A reference assembly 5 is provided, in order to mark two of the characteristic phase points of the phase progression with a time stamp (t0, t1). These are, for example, time points t0, t1 in the voltage progression 2 represented in the diagram 94 of one of the phases 81, 82, 83 at which a zero-crossing on a positive voltage output (voltage rise) is present.

The sensor devices 97-102 transmit electromagnetic signals to an evaluation assembly (10). An exemplary characteristic of electromagnetic signals 9 over time is plotted, which is produced from one of the measurements of a sensor device 97-102. Each of the electromagnetic signals 9 receives a time stamp from a time stamp assembly 103.

The evaluation assembly 10 receives, in a simplified form and represented for only one of the three phases, the time-stamped electromagnetic signals 9 and the phase progression 2 with the phase points t0, t1, which are also marked by time stamping. The evaluation assembly 10 is configured to identify partial discharge signals in the electromagnetic signals 9, and to consider the time stamps of the characteristic phase points t0, t1 and the time stamps of the partial discharge signals in a superimposition 12 of the sinusoidal phase progression 9. This superimposition 12 permits a cause of the respective partial discharge to be detected.

The invention claimed is:

1. A method for detecting partial discharges of an electrical operating device, comprising:
    capturing electromagnetic signals at different positions of the electrical operating device in a decentralized manner by a plurality of sensor devices,
    centrally determining a sinusoidal phase progression for an electric voltage by a voltage measuring assembly, wherein the electric voltage is centrally measured on a voltage converter for the operating device; and
    providing at least one phase point characteristic of the phase progression with a first time stamp by a reference assembly, and
    providing each of the electromagnetic signals with a second time stamp by a time stamp assembly, and
    determining a partial discharge signal in each of the electromagnetic signals by an evaluation assembly, and
    wherein at least one of the first time stamps of the characteristic phase point and the second time stamps of the partial discharge signals are taken into consideration by the evaluation assembly in a superimposition of the sinusoidal phase progression with the partial discharge signals.

2. The method as claimed in claim 1,
    wherein internal and/or external antennae are employed as sensor devices for reception of electromagnetic signals.

3. The method as claimed in claim 1,
    wherein a gas-insulated electrical switchgear is employed as an operating device.

4. The method as claimed in claim 1,
    wherein the superimposition is evaluated in each case, in order to detect a cause of the respective partial discharge.

5. The method as claimed in claim 1,
    wherein the superimposition is executed by a point-on-wave method in each case.

6. The method as claimed in claim 1,
    wherein a precise time protocol is employed for the first and second time stamps.

7. The method as claimed in claim 6,
    wherein the first and second time stamps are defined to a margin of accuracy of less than 100 µs.

8. The method as claimed in claim 1,
    wherein the sinusoidal phase progression is defined for a plurality of phases, and the partial discharge signals are assigned to one of the plurality of phases in each case.

9. The method as claimed in claim 1,
    wherein the time points of zero-crossings on a positive voltage rise are employed as characteristic phase points.

10. An assembly for detecting partial discharges of an electrical operating device, comprising:
    a plurality of sensor devices, which are configured for a decentralized detection of electromagnetic signals at various positions on the operating device,
    a voltage measuring assembly for a central determination of a sinusoidal phase progression of an electric voltage, wherein the voltage measuring assembly is configured for the central determination of the electric voltage on a voltage converter for the operating device; and
    a reference assembly, which is configured to apply a first time stamp to at least one of the characteristic phase points of the phase progression, and
    a time stamp assembly for an application of a second time stamp to each of the electromagnetic signals, and
    an evaluation assembly, which is configured to identify a partial discharge signal in the electromagnetic signals in each case, and to consider the at least one first time stamp of the characteristic phase point and the second time stamps of each of the electromagnetic signals in a superimposition of the sinusoidal phase progression with each of the electromagnetic signals in detecting the partial discharge.

11. The assembly as claimed in claim 10, wherein the sensor devices comprise internal and/or external antennae for reception of electromagnetic signals.

12. The assembly as claimed in claim 9, wherein the operating device comprises a gas-insulated electrical switchgear.

13. The assembly as claimed in claim 10, wherein the evaluation assembly is configured to evaluate the superimposition in each case, in order to identify a cause of the respective partial discharge.

\* \* \* \* \*